US009754938B1

(12) United States Patent
Feng et al.

(10) Patent No.: US 9,754,938 B1
(45) Date of Patent: Sep. 5, 2017

(54) SEMICONDUCTOR DEVICE AND METHOD OF FABRICATING THE SAME

(71) Applicant: UNITED MICROELECTRONICS CORP., Hsin-Chu (TW)

(72) Inventors: Li-Wei Feng, Kaohsiung (TW); Tong-Jyun Huang, Tainan (TW); Shih-Hung Tsai, Tainan (TW); Jia-Rong Wu, Kaohsiung (TW); Tien-Chen Chan, Tainan (TW); Yu-Shu Lin, Pingtung County (TW); Jyh-Shyang Jenq, Pingtung County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/187,800

(22) Filed: Jun. 21, 2016

(30) Foreign Application Priority Data

May 19, 2016 (TW) .............................. 105115627 A

(51) Int. Cl.
| | |
|---|---|
| *H01L 27/088* | (2006.01) |
| *H01L 29/06* | (2006.01) |
| *H01L 21/8234* | (2006.01) |
| *H01L 21/311* | (2006.01) |
| *H01L 29/66* | (2006.01) |

(52) U.S. Cl.
CPC .... *H01L 27/0886* (2013.01); *H01L 21/31144* (2013.01); *H01L 21/823431* (2013.01); *H01L 21/823437* (2013.01); *H01L 29/0649* (2013.01); *H01L 29/66545* (2013.01)

(58) Field of Classification Search
CPC ..... H01L 21/823431; H01L 21/823821; H01L 21/845
See application file for complete search history.

(56) References Cited

U.S. PATENT DOCUMENTS

| | | | |
|---|---|---|---|
| 7,993,999 B2 | 8/2011 | Basker | |
| 8,895,395 B1 | 11/2014 | Kerber | |
| 9,450,072 B2 * | 9/2016 | Chou | ................ H01L 29/66545 |
| 9,536,789 B1 * | 1/2017 | Cheng | ................ H01L 21/8232 |
| 2013/0037886 A1 * | 2/2013 | Tsai | .................. H01L 21/82382 |
| | | | 257/351 |
| 2013/0105867 A1 * | 5/2013 | Wang | ................ H01L 29/66818 |
| | | | 257/288 |
| 2014/0084351 A1 | 3/2014 | Huang | |
| 2015/0262812 A1 * | 9/2015 | Liu | ..................... H01L 21/0274 |
| | | | 438/587 |
| 2016/0254261 A1 * | 9/2016 | Machkaoutsan | ...... H01L 21/321 |
| | | | 257/369 |
| 2017/0005090 A1 * | 1/2017 | Ando | ................. H01L 27/0886 |

* cited by examiner

*Primary Examiner* — Benjamin Sandvik
(74) *Attorney, Agent, or Firm* — Winston Hsu

(57) ABSTRACT

A semiconductor device includes a substrate, fin-shaped structures, a protection layer, epitaxial layers, and a gate electrode. The fin-shaped structures are disposed in a first region and a second region of the substrate. The protection layer conformally covers the surface of the substrate and the sidewalls of fin-shaped structures. The epitaxial layers respectively conformally and directly cover the fin-shaped structures in the first region. The gate electrode covers the fin-shaped structures in the second region, and the protection layer is disposed between the gate electrode and the fin-shaped structures.

8 Claims, 12 Drawing Sheets

SEMICONDUCTOR DEVICE AND METHOD OF FABRICATING THE SAME

BACKGROUND OF THE INVENTION

1. Field of the Invention

The present invention relates generally to the field of semiconductor devices and manufacturing methods thereof, and more particularly to the semiconductor devices with metal gates where epitaxial layers are disposed under the metal gates.

2. Description of the Prior Art

With the increasing miniaturization of semiconductor devices, various multi-gate MOSFET devices have been developed. The multi-gate MOSFETs are advantageous for the following reasons. First, the manufacturing processes of the multi-gate MOSFET devices can be easily integrated into the processes for fabricating conventional logic device processes. In addition, since the three-dimensional structure of a multi-gate MOSFET increases the overlapping area between the gate and the substrate, its channel region can be controlled more effectively. Therefore, some of the problems, such as drain-induced barrier lowering (DIBL) and short channel effect (SCE), that often occurs in small-sized planar MOSFETs can be resolved effectively by adopting multi-gate MOSFETs. Moreover, the channel width of the multi-gate MOSFET is much wider than that of the planar MOSFET. As a result, the electric current between source/drain regions of the MOSFET may be increased. However, charge carrier mobility of the channel regions is still not high enough for the multi-gate MOSFETs.

SUMMARY OF THE INVENTION

To this end, one object of the embodiments of the present invention is to provide a semiconductor device and a fabrication method thereof so as to overcome the drawbacks of conventional technologies.

According to one embodiment of the present invention, a semiconductor device is disclosed and includes at least a substrate, fin-shaped structures, a protection layer, epitaxial layers, and a gate electrode. The fin-shaped structures are disposed in a first region and a second region of the substrate. The protection layer conformally covers the surface of the substrate and the sidewalls of fin-shaped structures. The epitaxial layers respectively conformally and directly cover the fin-shaped structures in the first region. The gate electrode covers the fin-shaped structures in the second region, and the protection layer is disposed between the gate electrode and the fin-shaped structures.

According to another embodiment of the present invention, a method for fabricating a semiconductor device is also disclosed and includes the following steps: providing a substrate having a first region and a second region; forming a plurality of fin-shaped structures respectively disposed in the first region and the second region of the substrate; forming a protection layer conformally covering the substrate and the fin-shaped structures; forming an interlayer dielectric in the first region and the second region so that the protection layer in the first region and the second region is partially exposed from the interlayer dielectric; forming an etch mask covering the fin-shaped structures in the second region; and etching the protection layer exposed from the interlayer dielectric in the first region before removing the etch mask.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

For more complete understanding of the present invention and its advantage, reference is now made to the following description, taken in conjunction with accompanying drawings, in which.

DETAILED DESCRIPTION

Figure 1:
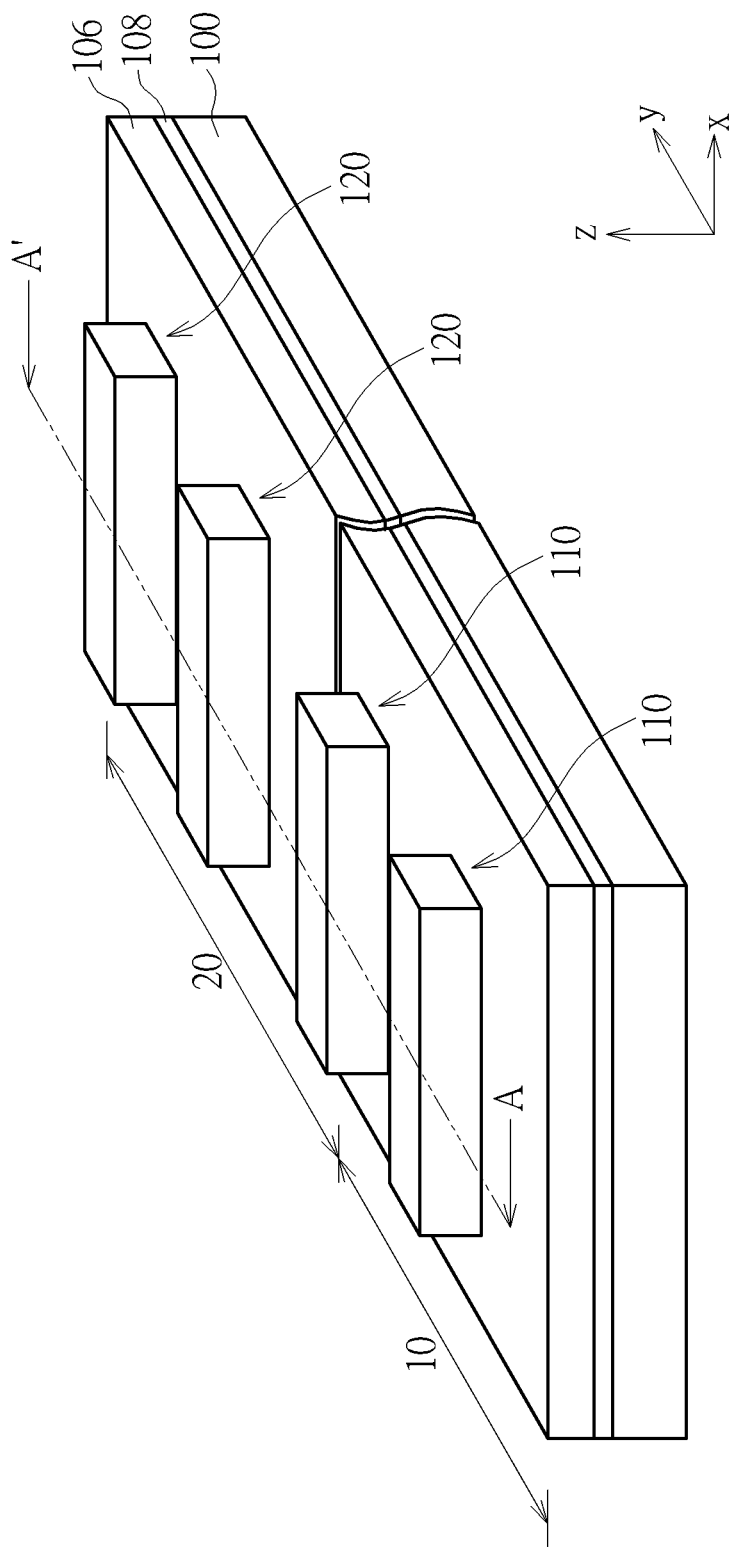
FIG. 1 is a perspective view of a structure having a substrate and fin-shaped structures thereon.

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are not to scale and some dimensions are exaggerated for clarity of presentation. Also, where multiple embodiments are disclosed and described as having some features in common, like or similar features will usually be described with same reference numerals for ease of illustration and description thereof.

FIG. 1 through FIG. 6 are schematic, cross-sectional diagrams respectively showing semiconductor device at different processing stages in accordance with a first embodiment of the present invention. FIG. 1 is a perspective view of a structure having a substrate and fin-shaped structures thereon. Please refer to FIG. 1. At the beginning of the process, a substrate 100 defined with a first region 10 and a second region 20, such as a core device region and a peripheral region, may be provided. Preferably, according to one embodiment of the present invention, the first region 10 may be a logic region and the second region 20 may be an input/output (I/O) region where devices with required functionalities are fabricated respectively. Fin-shaped structures 110 and 120 are respectively disposed in the first region 10 and the second region 20 of the substrate 100, and a shallow trench isolation structure 106 is also disposed on the substrate 10 to surround the lower portions of the fin-shaped structures 110 and 120. In this way, the upper portions of the fin-shaped structures 110 and 120 are able to protrude from the surface of the shallow trench isolation structure 106. The long axes of the fin-shaped structures 110 and 120 may be parallel to a first axis X, and the fin-shaped structures 110 and 120 may be arranged along a second axis Y with equal or unequal pitches. Besides, the fin-shaped structures 110 and 120 may protrude from the substrate 10 along a third axis z. It should be noted that the first, second and third axes disclosed herein are preferably orthogonal to one another in accordance with one embodiment of the present invention, but not limited thereto. Furthermore, a protection layer 108, such as an oxide layer, may be conformally disposed on the surfaces of the fin-shaped structures 110 and 120 and on the surface of the substrate 100. Therefore, the protruding portions of the fin-shaped structures 110 and 120 may be completely covered by the protection layer 108.

Figure 2:
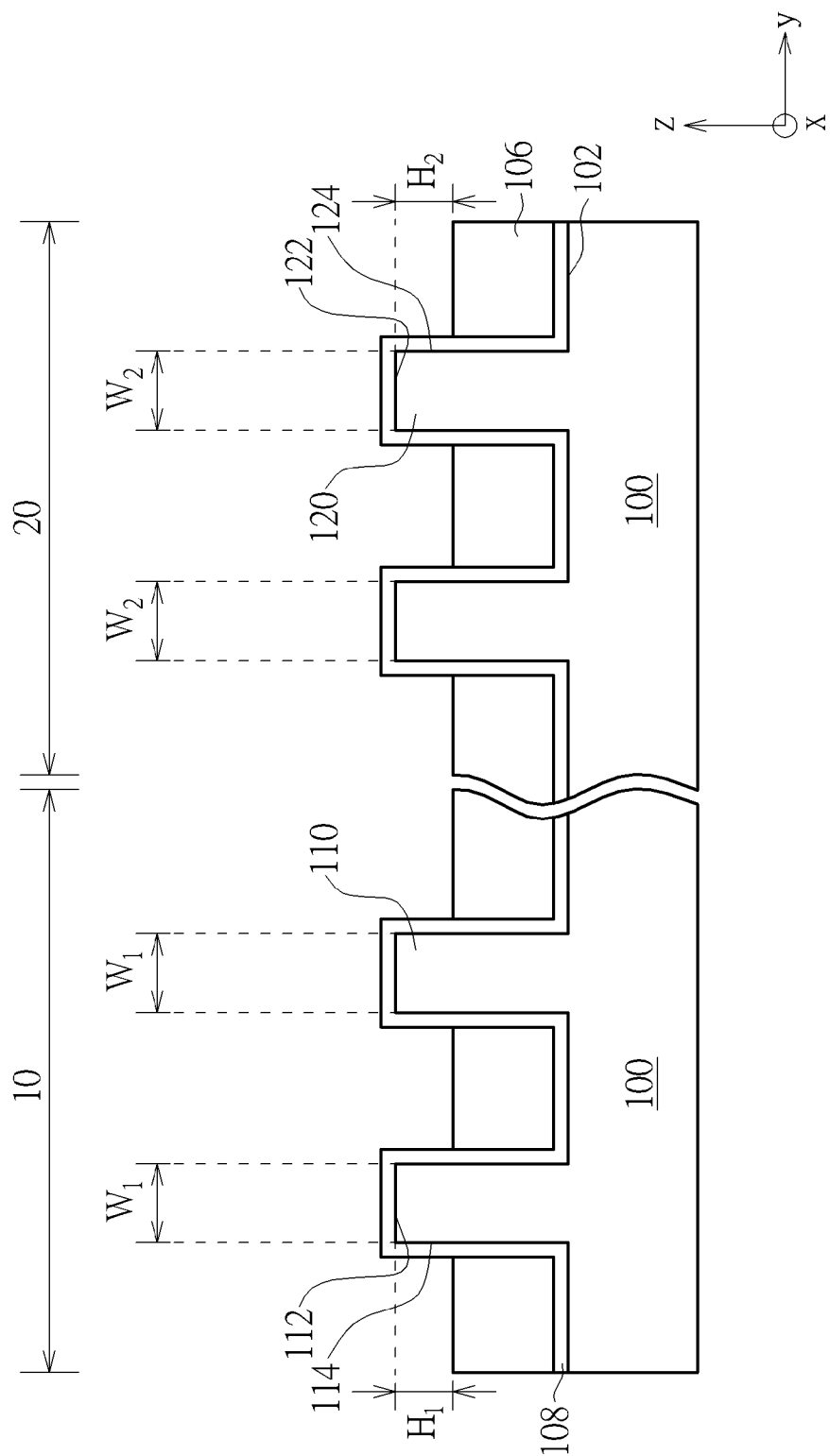
FIG. 2 is a schematic, cross-sectional diagram taken along line A-A' in FIG. 1.

FIG. 2 is a schematic, cross-sectional diagram taken along line A-A' in FIG. 1. Please refer to FIG. 2. The fin-shaped structures 110 and 120 in the first and second regions 10 and 20 may have initial heights $H_1$ and $H_2$ and initial widths $W_1$ and $W_2$ respectively. The protection layer 108 conformally covers the top surfaces 112 and 122 and the sidewalls 114 and 124 of the fin-shaped structures 110 and 120. Also, the protection layer 108 conformally covers the top surface 102 of the substrate 100. It should be noted that portions of the protection layer 108 on the fin-shaped structures 110 and 120 are also protruding from the top surface of the shallow trench isolation structure 106.

The substrate 100 may be a semiconductor substrate (such as a silicon substrate), a silicon containing substrate (such as a silicon carbide substrate), a III-V group-on-silicon (such as GaN-on-silicon) substrate, a graphene-on-silicon substrate, a silicon-on-insulator (SOI) substrate or an epitaxy-containing substrate. According to this embodiment, a spacer self-aligned double patterning (SADP) technology is applied for fabricating the fin-shaped structures 110 and 120. Through this technology, the initial widths $W_1$ and $W_2$ of the fin-shaped structures 110 and 120 may be less than the minimum exposure limit which can be achieved by current photolithographic processes. In other words, fin-shaped structures 110 and 120 may be sub-lithographic features, but not limited thereto. The process utilized to form the shallow trench isolation structure 106 may include a deposition process and an etching back process. The deposition process may be chosen from a high density plasma CVD (HDP-CVD) process, a sub-atmosphere CVD (SACVD) process, a spin-on-dielectric (SOD) process or a flowable chemical vapor deposition (FCVD) process, but not limited thereto. The protection layer 108, preferably made of oxide, may be fabricated by oxidation process or deposition process and may be used as a gate oxide layer. The thickness of the protection layer 108 is preferably between 10 Angstroms to 80 Angstroms, but not limited thereto.

Figure 3:
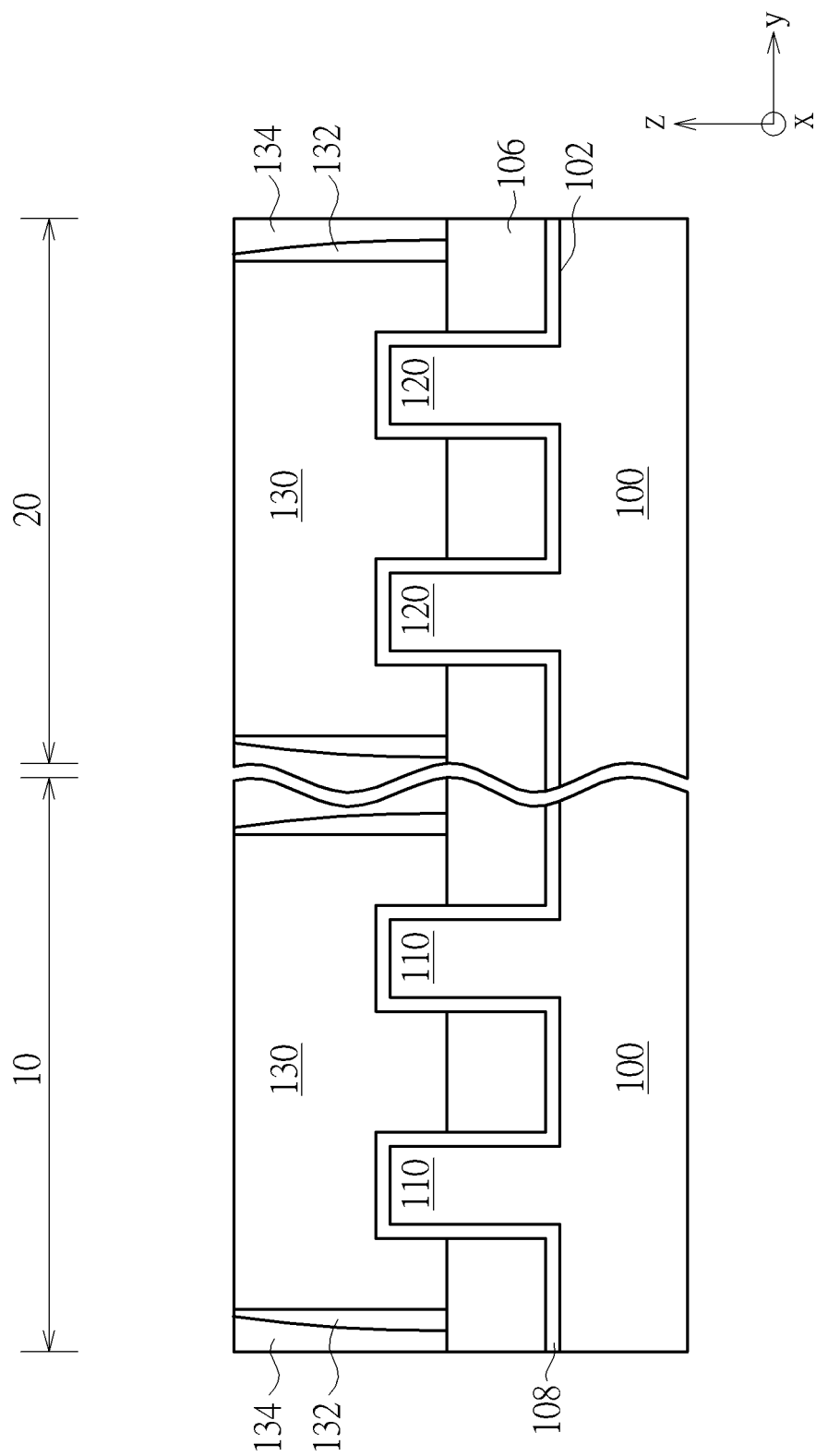
FIG. 3 is a schematic, cross-sectional diagram of a structure with fin-shaped structures covered by dummy gate structures in accordance of one embodiment of the present invention.
Figure 4:
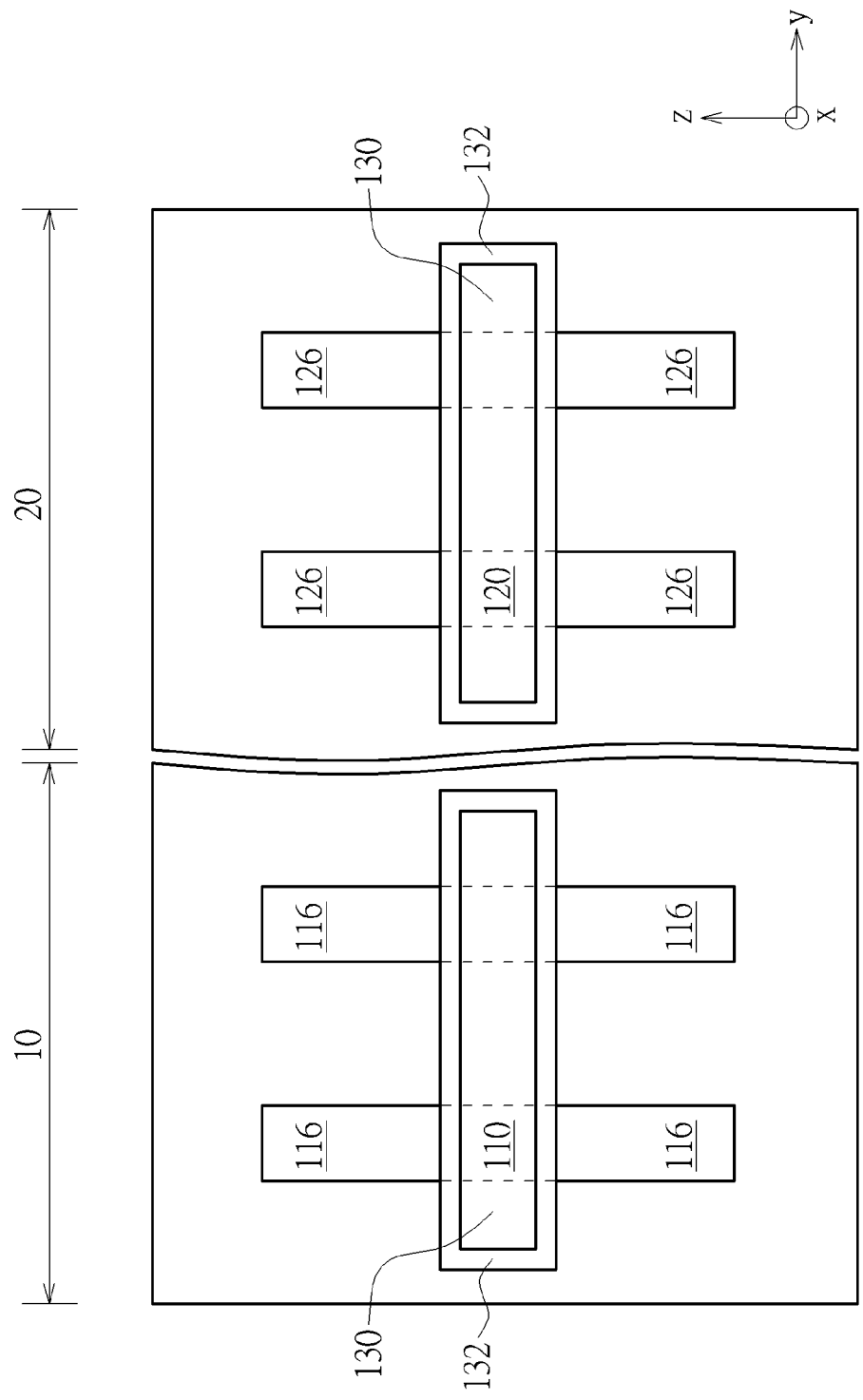
FIG. 4 is a top view of a structure with fin-shaped structures covered by dummy gate structures.

FIG. 3 is a schematic, cross-sectional diagram of a structure with fin-shaped structures covered by dummy gate structures in accordance of one embodiment of the present invention. Please refer to FIG. 3. After the processing stage shown in FIG. 2, dummy gate structures 130 are respectively fabricated in the first region 10 and the second region 20 to respectively cross two adjacent fin-shaped structures 110 and 120. Each of the dummy gate structures may be a stack structure including a dummy gate dielectric layer, a dummy gate electrode, and a cap layer, but not limited thereto. Then, spacers 132 are fabricated on the sidewalls of the dummy gate structures 130 by the deposition and etching processes. Subsequently, an interlayer dielectric 134 surrounding the dummy gate structures 130 and the spacers 132 is fabricated by the deposition and planarization processes.

It should be noted that another processing step may be performed between the processes of fabricating the dummy gate structures and fabricating the interlayer dielectric. Please refer to FIG. 4 which is a top view of a structure with fin-shaped structures covered by dummy gate structures. For example, an etching process may be carried out between the processes of fabricating the dummy gate structures 130 and fabricating the interlayer dielectric 134. In this way, the protection layer 108 exposed from the dummy gate structures 130 and the spacers 132 may be removed so as to expose the corresponding fin-shaped structures 110 and 120. Subsequently, at least one epitaxial growth process is carried out to grow epitaxial layers on the fin-shaped structures 110 and 120 protection layer 108 exposed from the dummy gate structures 130 and the spacers 132. The tensile stress or compression stress applied by the epitaxial layer may increase the carrier's mobility of the corresponding semiconductor device.

When completion of the processing steps above, the dummy gate structures 130 in the first and second regions 10 and 20 may respectively cross and overlap portions of the corresponding fin-shaped structures 110 and 120. Besides, the epitaxial layers 116 and 126 are only grown on the fin-shaped structures 110 and 120 exposed from the dummy gate structures 130 and the spacers 132. Afterwards, the dummy gate structures 130 are removed so as to form trenches in the first and second regions 10 and 20.

Figure 5:
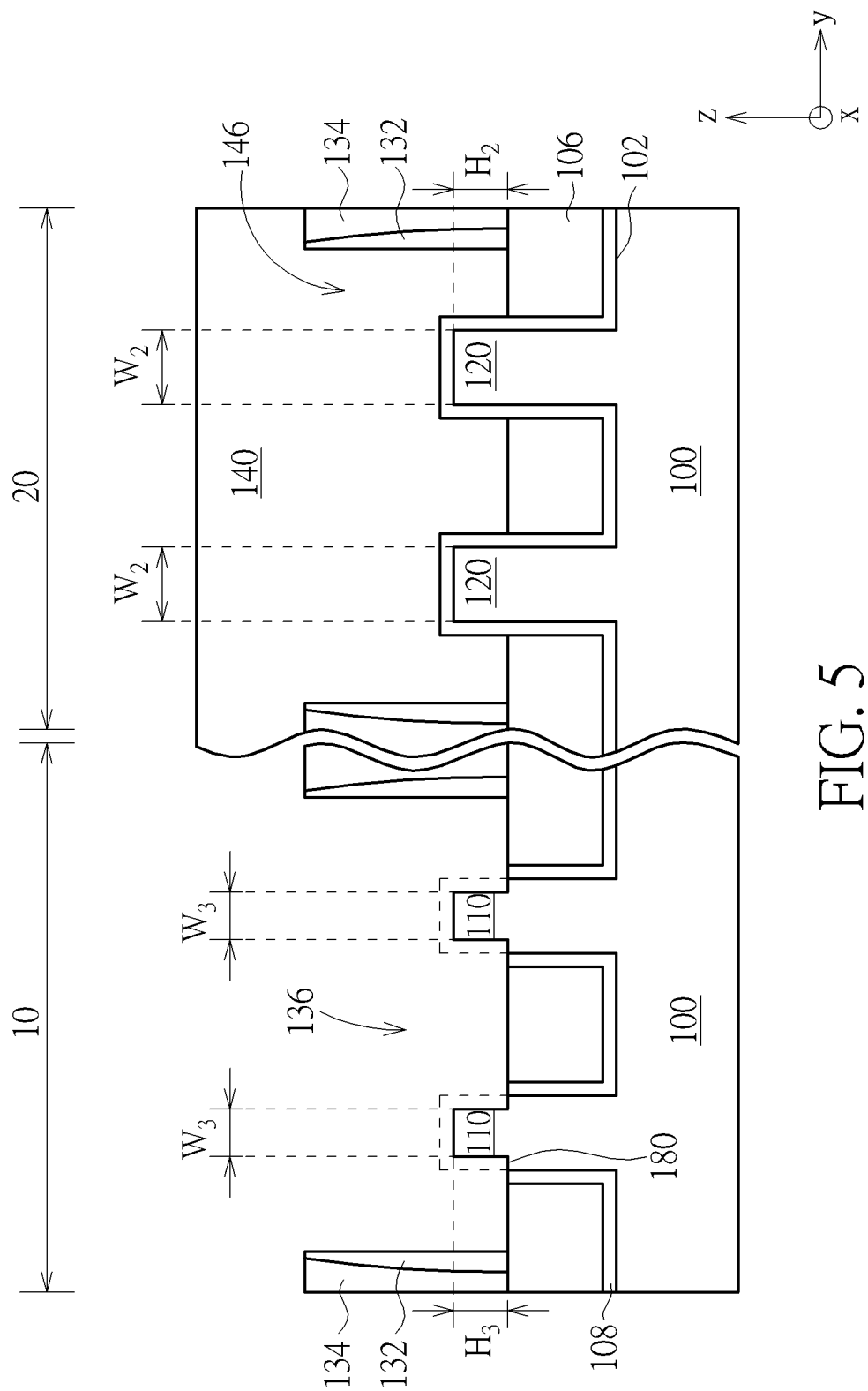
FIG. 5 is a schematic, cross-sectional diagram of a structure having fin-shaped structures with stair-shaped sidewalls.

FIG. 5 is a schematic, cross-sectional diagram of a structure having fin-shaped structures with stair-shaped sidewalls. Please refer to FIG. 5. A mask 140 may be fabricated in the second region after the formation of the trenches 136 and 146. Preferably, the mask 140 is a patterned photoresist which may be fabricated by coating photoresist and performing a photolithographic process. Afterwards, by using the mask 140 as an etch mask, at least one etching process is carried out to etch the exposed protection layer 108 and the shallow trench isolation structure 106 in the trench 136. During the etching process, the protruding portions of the fin-shaped structures 110 in the first region 10 may be trimmed slightly. In this way, the heights and the widths of the fin-shaped structures 110 may be reduced, and the fin-shaped structures 110 may therefore have stair-shaped sidewalls. In detail, the trimmed fin-shaped structures 110 may have reduced widths $W_3$ and reduced heights $H_3$. In other words, the top surfaces of the fin-shaped structures 110 in the first region 10 may have widths less than the widths of the top surfaces of the fin-shaped structures 120 in the second region 20, and the top surfaces of the fin-shaped structures 110 in the first region 10 may be lower than the top surfaces of the fin-shaped structures 120 in the second region 20. Then, the mask 140 is removed to expose the protection layer 108 in the trench 146.

Then, at least one epitaxial growth process may be carried out to grow epitaxial layers on the fin-shaped structures 110 protruding from the shallow trench isolation structure 106.

The epitaxial growth process above may be a molecular beam epitaxial growth process, a co-flow epitaxial growth process, acyclic selective epitaxial growth process and/or other suitable epitaxial growth process. It should be noted that, since the fin-shaped structures 120 in the trench 146 is covered by the protection layer 108 during the process of growing the epitaxial layers, the epitaxial layers may be prevented from growing on the fin-shaped structures 120 in the trench 146. Besides, the epitaxial growth process is preferably carried out at the temperature from 300 to 600° C. in order to make the epitaxial layers conformally grow on the surfaces of the fin-shaped structures 110.

Figure 6:
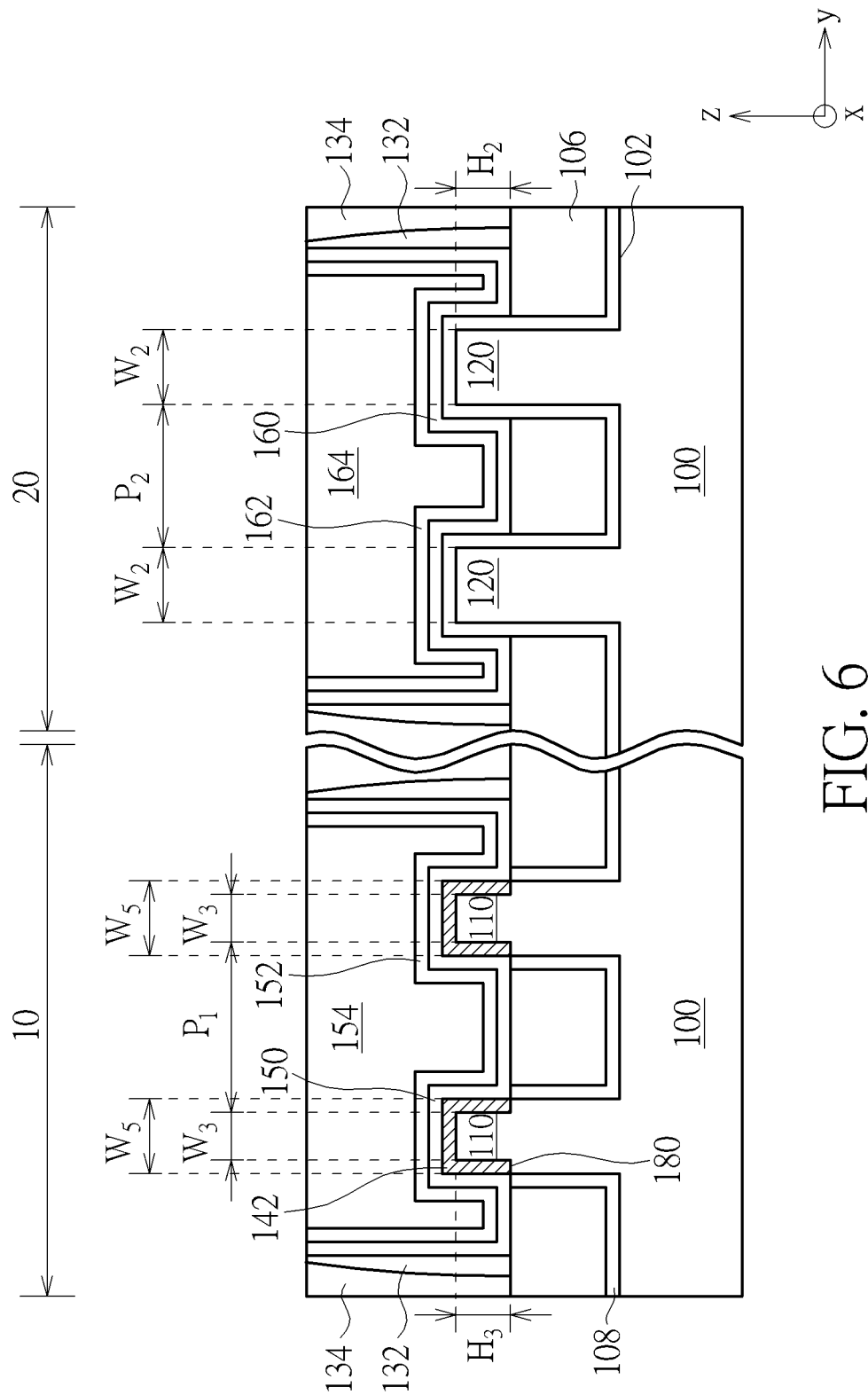
FIG. 6 is a schematic, cross-sectional diagram of a structure with fin-shaped structures covered by metal gate structures in accordance of one embodiment of the present invention.

FIG. 6 is a schematic, cross-sectional diagram of a structure with fin-shaped structures covered by metal gate structures in accordance of one embodiment of the present invention. Please refer to FIG. 6. After the epitaxial growth process, interface dielectric layers 150 and 160, high-k dielectric layers 152 and 162 and gate metal layers 154 and 164 may be sequentially deposited into the trenches 136 and 146 and on the interlayer dielectric 134. Each of the gate metal layers 154 and 164 may further consist of work function metal layer and gate metal layer. Subsequently, the interface dielectric layers 150 and 160, the high-k dielectric layers 152 and 162 and the gate metal layers 154 and 164 outside the trenches 136 and 146 may be removed completely by at least one planarization process.

The semiconductor device in accordance of the present invention is fabricated through the processes disclosed above. Please refer to FIG. 6. For the fin-shaped structures 110 in the first region 10, the fin-shaped structures 110 protruding from the shallow trench isolation structure 106 may have reduced heights and widths. In detail, each of the fin-shaped structures 110 in the trench 136 may have stair-shaped sidewalls, and the tread 180 of each of the stair-shaped sidewalls is proximately level with the top surface of the adjacent shallow trench isolation structure 106. The epitaxial layers 142 in the trench 136 may conformally disposed on the surfaces of the fin-shaped structures 110 and is in direct contact with the treads 180 of the fin-shaped structures 110. In addition, each of the epitaxial layers 142 is disposed between each of the gate metal layers 154 and each of the fin-shaped structures 110. On the other hand, for the fin-shaped structures 120 in the first region 20, the fin-shaped structures 120 protruding from the shallow trench isolation structure 106 may still have flat sidewalls, and the top surfaces and sidewalls of the fin-shaped structures 120 are covered by the protection layer 108. The protection layer 108 in the trench 146 is disposed between each of the gate metal layers 164 and each of the fin-shaped structures 120. Besides, the protection layer 108 together with the corresponding dielectric layers 162 in the trench 146 may be used as a gate dielectric layer.

Preferably, the composition of the epitaxial structure 142 is different from that of the underneath fin-shaped structures 110, e.g. they preferably have different lattice constants. For example, in a case where the epitaxial structure 142 is part of a P-type field effect transistor, the lattice constant of the epitaxial structure 142 is preferably greater than that of the fin-shaped structures 110. Specifically, when the main composition of the fin structures are silicon, the composition of the epitaxial structure 142 may be silicon germanium ($Si_{1-x}Ge_x$, $X \leq 1$). Optionally, the germanium concentration inside the epitaxial structure 142 may increase from the bottom to the top of the epitaxial structure 40 or increase from the inside to the outside of the epitaxial structure 142, but not limited thereto. When the epitaxial structure 142 is part of an N-type field effect transistor, the lattice constant of the epitaxial structure 142 is preferably less than that of the fin-shaped structures 110. Specifically, when the main composition of the fin structures are silicon, the composition of the epitaxial structure 142 may be silicon carbide ($Si_{1-x}C_x$, $X<1$), silicon phosphorous (SiP), or other suitable materials. Optionally, the carbon concentration inside the epitaxial structure 142 may increase from the bottom to the top of the epitaxial structure 142 or increase from the inside to the outside of the epitaxial structure 142, but not limited thereto.

Since each of the protruding portions of the fin-shaped structures 110 in the trench 136 has a reduced height $H_3$ and a reduced width $W_3$, each of the fin-shaped structures 110 and the corresponding overlaying epitaxial layer 142 may have a total width $W_5$ approximately the same as the width $W_2$ of each of the fin-shaped structures 120 in the second region 20. In other words, each of the fin-shaped structures 110 and the corresponding overlaying epitaxial layer 142 may have a total width $W_5$ approximately the same as the original width $W_1$ of each of the fin-shaped structures 110 in the first region 10. In a circumstance where the fin-shaped structures 110 and 120 have equal pitches, the distance $P_1$ between two adjacent epitaxial layers 142 in the first region 10 may maintain approximately the same as the distance $P_2$ between the two adjacent fin-shaped structures 120 in the second region 20. In other words, the distance or spacing between two adjacent fin-shaped structures 110 may be kept the same in either of the conditions where epitaxial layers 142 are disposed or not disposed. As a result, the electronic elements of the semiconductor devices can be kept as compact as possible. Furthermore, the protection layer 108 in the preceding embodiment may be used not only as a mask for preventing the growth of the epitaxial layers but as a part of gate dielectric layer of the semiconductor device. Therefore, there is no need to remove the protection layer 108 during the fabrication process, and the fabrication may thus be simplified.

After the completion of the processes above, optional processes, such as depositing inter metal dielectric (IMD) on the substrate, fabricating self-aligned contact structures, and so forth, may be carried out. The detailed description of these processes is omitted herein for the sake of brevity.

Figure 10:
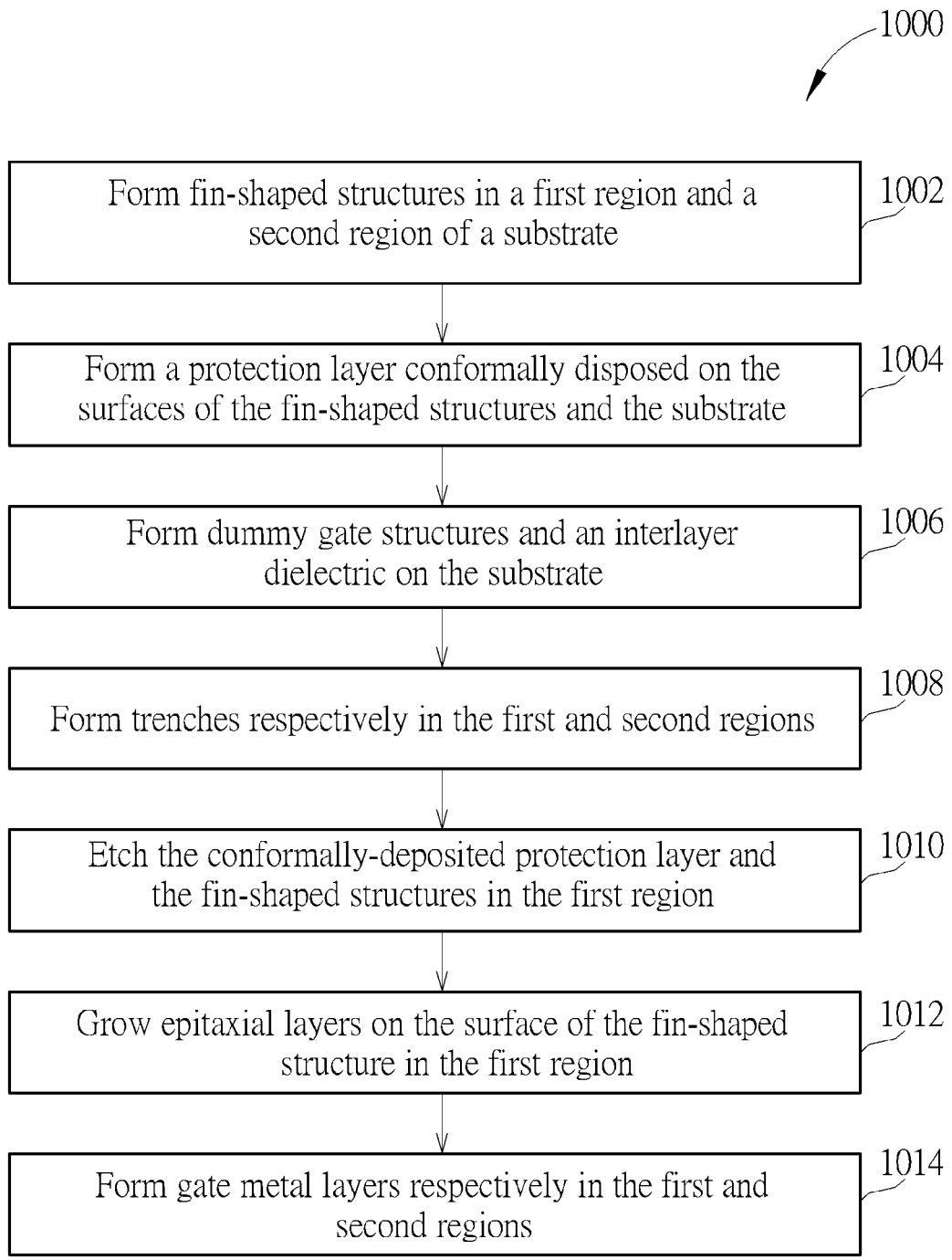
FIG. 10 is a flow chart of fabricating a semiconductor device in accordance of a first embodiment of the present invention.

FIG. 10 is a flow chart of fabricating a semiconductor device in accordance of a first embodiment of the present invention. Please refer to the flow chart in FIG. 10. A method for fabricating a semiconductor device in accordance of one embodiment of the present invention includes the following sequential steps: (1) step 1002: forming fin-shaped structures in a first region and a second region of a substrate; (2) step 1004: forming a protection layer conformally disposed on the surfaces of the fin-shaped structures and the substrate; (3) step 1006: forming dummy gate structures and an interlayer dielectric on the substrate; (4) step 1008: forming trenches respectively in the first and second regions; (5) step 1010: etching the conformally-deposited protection layer and the fin-shaped structures in the first region; (6) step 1012: growing epitaxial layers on the surface of the fin-shaped structure in the first region; and (7) step 1014: forming gate metal layers respectively in the first and second regions. The method steps, processes, and operations described herein are not to be construed as necessarily requiring their performance in the particular order discussed or illustrated, unless specifically identified as an order of performance. It is also to be understood that additional or alternative steps may be employed.

Several embodiments of the present invention are disclosed in detail in the following paragraphs.

Figure 7:
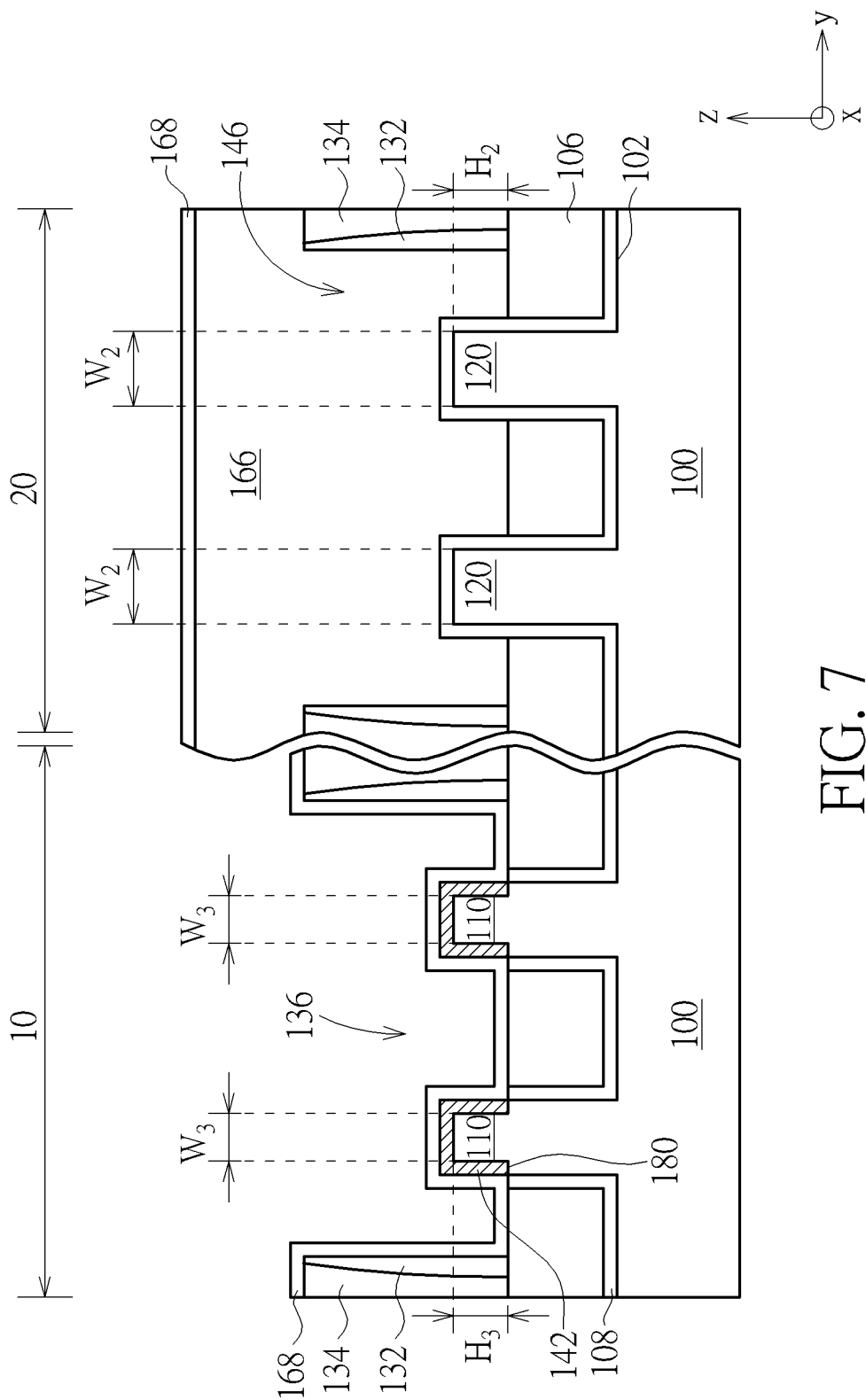
FIG. 7 and FIG. 8 are schematic, cross-sectional diagrams respectively showing semiconductor devices at different processing stages in accordance with a second embodiment of the present invention.
Figure 8:
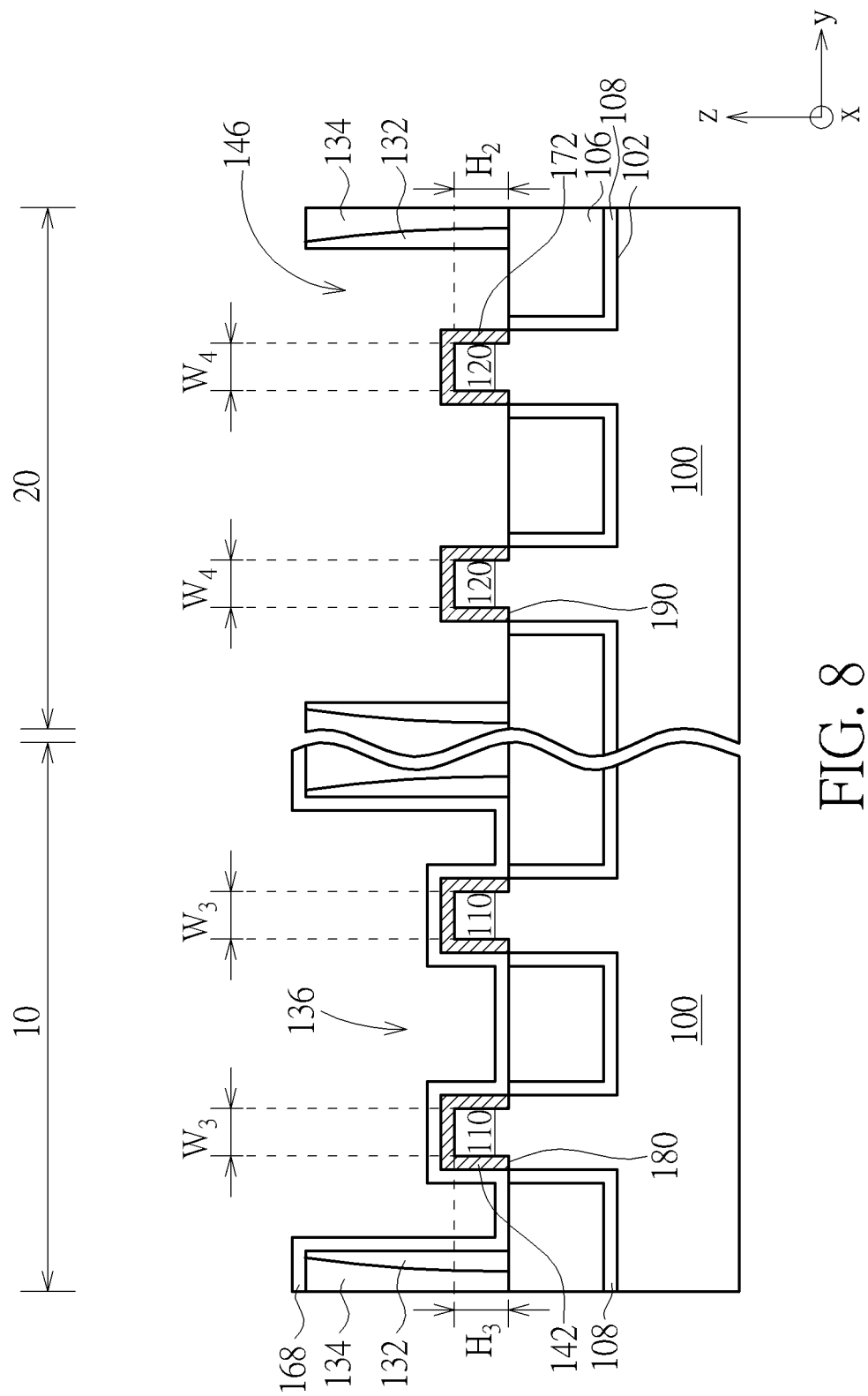

FIG. 7 and FIG. 8 are schematic, cross-sectional diagrams respectively showing semiconductor devices at different processing stages in accordance with a second embodiment of the present invention. One of the differences between the structure of the first embodiment and that of the second embodiment is that each of the fin-shaped structures in the second region according to the second embodiment has stair-shaped sidewalls and epitaxial layers are disposed on the stair-shaped sidewalls.

In detail, parts of the processing stages of the second embodiment are similar to the processing stages shown in FIG. 1 to FIG. 5 of the first embodiment. Besides, the second embodiment also includes the processes of removing etch mask and growing the epitaxial layers on the fin-shaped structures as described in the first embodiment.

Then, referring to FIG. 7, a mask 166, such as patterned photoresist, are fabricated in the second region 20 in a way that the mask 166 may cover the fin-shaped structures 120 and fills up the trench 146 in the second region 20. Subsequently, a dielectric layer 168 is deposited to conformally cover the epitaxial layers 142 in the first region 10 and the mask 166 in the second region 20.

The mask 166 in the second region 20 is then removed so as to expose the protection layer 108 in the trench 146 of the second region 20. At this time, the dielectric layer 168 still covers the fin-shaped structures 110 in the first region 10. Then, at least more etching process is performed to etch the protection layer 108 protruding from the shallow trench isolation structure 106 in the second region 20. During the etching process, the fin-shaped structures 120 protruding from the shallow trench isolation structure 106 may also be partially etched. As a result, the height and width of each of the fin-shaped structures 120 protruding from the shallow trench isolation structure 106 may be reduced so as to generate stair-shaped sidewalls.

Then, referring to FIG. 8, at least one epitaxial growth process may be carried out to grow epitaxial layers 172 on the fin-shaped structures 120 protruding from the shallow trench isolation structure 106. The epitaxial growth process above may be a molecular beam epitaxial growth process, a co-flow epitaxial growth process, acyclic selective epitaxial growth process and/or other suitable epitaxial growth process. It should be noted that, since the epitaxial layers 142 in the trench 136 is covered by the dielectric layer 168 during the process of growing the epitaxial layers 172, the epitaxial layers 172 may be prevented from growing on the epitaxial layers 142 in the trench 136. Besides, the epitaxial growth process is preferably carried out at the temperature from 300 to 600° C. in order to make the epitaxial layers 172 conformally grow on the surfaces of the fin-shaped structures 110.

For the fin-shaped structures 120 in the second region 20, the fin-shaped structures 120 protruding from the shallow trench isolation structure 106 may have reduced heights and widths. In detail, each of the fin-shaped structures 120 in the trench 146 may have stair-shaped sidewalls, and the tread 190 of each of the stair-shaped sidewalls is proximately level with the top surface of the adjacent shallow trench isolation structure 106. The epitaxial layers 172 in the trench 146 may conformally disposed on the surfaces of the fin-shaped structures 120 and is in direct contact with the treads 190 of the fin-shaped structures 120. It should be noted that, since the epitaxial layers 142 and the epitaxial layers 172 are not fabricated concurrently, the compositions and thicknesses of the epitaxial layers 142 and 172 may be controlled independently.

The dielectric layer 168 is removed subsequently. Then, interface dielectric layers, high-k dielectric layers and gate metal layers may be sequentially deposited into the trenches 136 and 146 and on the interlayer dielectric 134. Subsequently, the interface dielectric layers, the high-k dielectric layers and the gate metal layers outside the trenches 136 and 146 may be removed completely by at least one planarization process so as to produce required metal gate structures.

Figure 11:
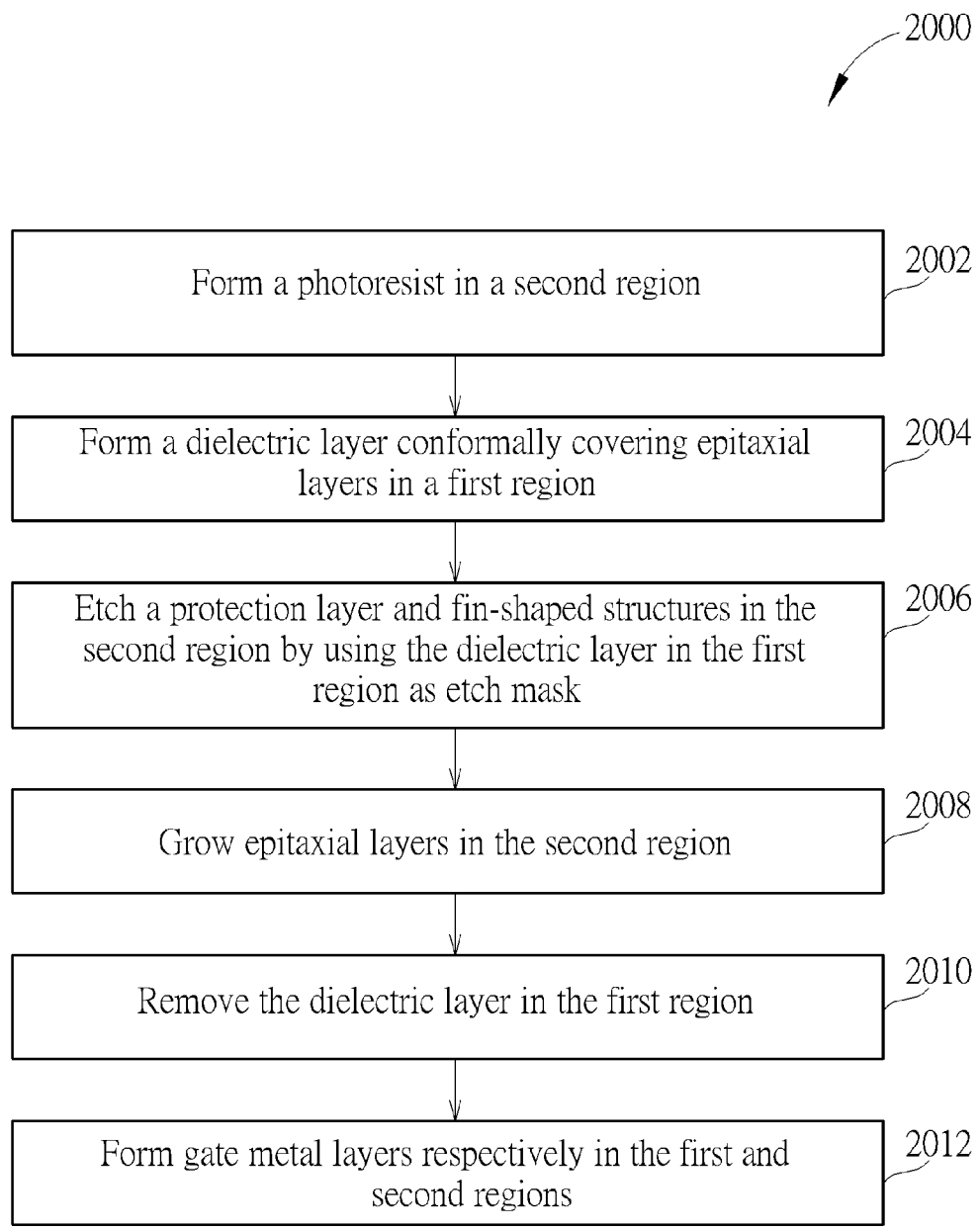
FIG. 11 is a flow chart of fabricating a semiconductor device in accordance of a second embodiment of the present invention.

FIG. 11 is a flow chart of fabricating a semiconductor device in accordance of a second embodiment of the present invention. Please refer to the flow chart in FIG. 11. A method for fabricating a semiconductor device in accordance of one embodiment of the present invention includes the following sequential steps: (1) step 2002: forming a photoresist in a second region; (2) step 2004: forming a dielectric layer conformally covering epitaxial layers in a first region; (3) step 2006: etching a protection layer and fin-shaped structures in the second region by using; the dielectric layer in the first region as etch mask; (4) step 2008: growing epitaxial layers in the second region; (5) step 2010: removing the dielectric layer in the first region; and (6) step 2012: forming gate metal layers respectively in the first and second regions. The method steps, processes, and operations described herein are not to be construed as necessarily requiring their performance in the particular order discussed or illustrated, unless specifically identified as an order of performance. It is also to be understood that additional or alternative steps may be employed.

Figure 9:
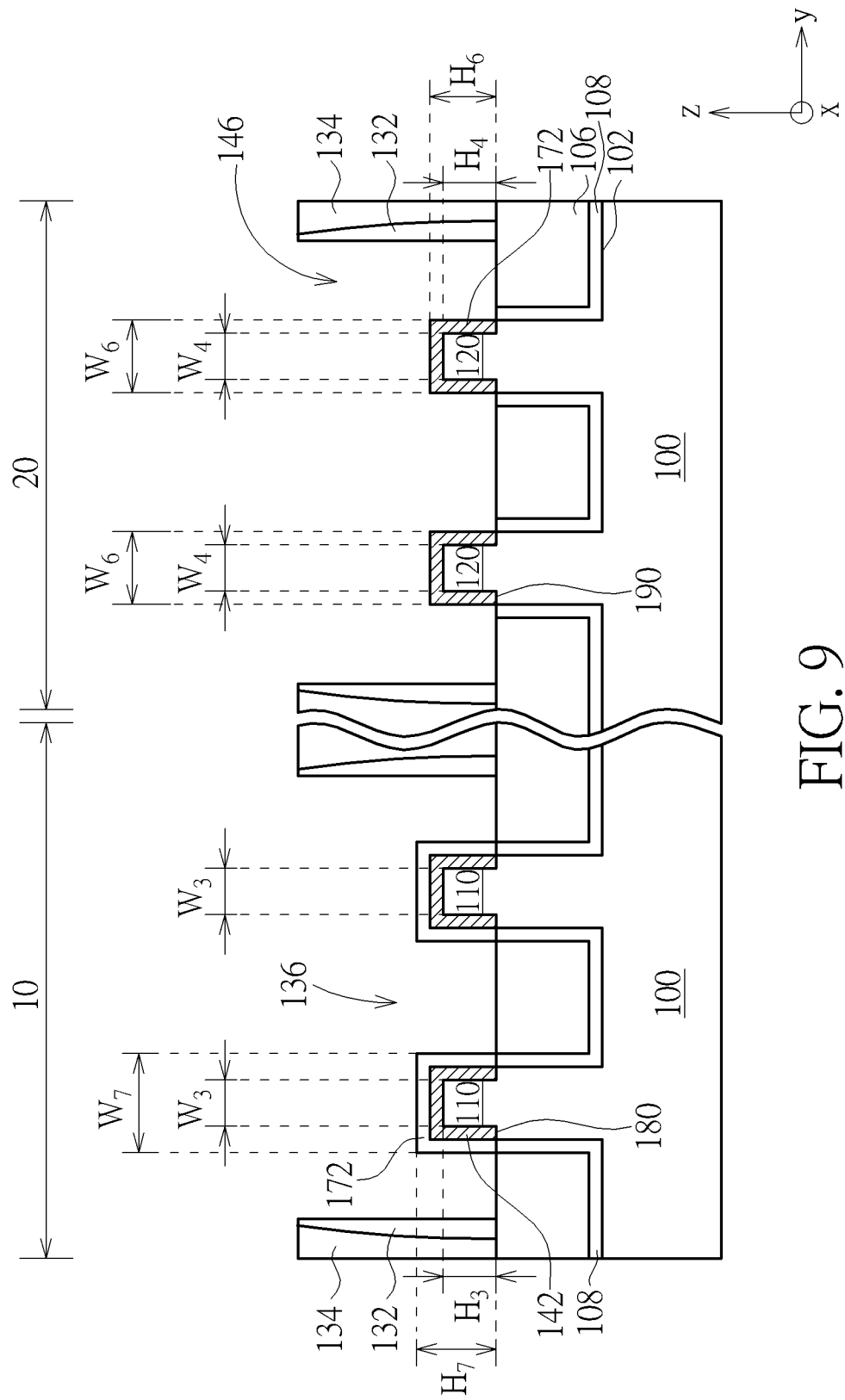
FIG. 9 is a schematic, cross-sectional diagram of fin-shaped structures with different numbers of epitaxial layers thereon.

FIG. 9 is a schematic, cross-sectional diagram of fin-shaped structures with different numbers of epitaxial layers thereon. In detail, parts of the processing stages of the third embodiment are similar to the processing stages shown in FIG. 1 to FIG. 5 of the first embodiment. Besides, the second embodiment also includes the processes of removing etch mask and growing the epitaxial layers on the fin-shaped structures as described in the first embodiment.

Afterwards, by using the epitaxial layers in the first region 10 as etch mask, at least one etching process is carried out to etch the exposed protection layer 108 and the shallow trench isolation structure 106 in the trench 146. During the etching process, the fin-shaped structures 120 protruding from the shallow trench isolation structure 106 in the second region 20 may be trimmed slightly. In this way, the heights and the widths of the fin-shaped structures 120 may be reduced, and the fin-shaped structures 120 may therefore have stair-shaped sidewalls.

Then, referring to FIG. 9, at least one epitaxial growth process may be carried out to grow epitaxial layers 172 on the fin-shaped structures 110 and 120 protruding from the shallow trench isolation structure 106. The epitaxial growth process above may be a molecular beam epitaxial growth process, a co-flow epitaxial growth process, a cyclic selective epitaxial growth process and/or other suitable epitaxial growth process. Besides, the epitaxial growth process is preferably carried out at the temperature from 300 to 600° C. in order to make the epitaxial layers 172 conformally grow on the surfaces of the fin-shaped structures 110 and 120.

In detail, the fin-shaped structures 110 and 120 protruding from the shallow trench isolation structure 106 may have reduced heights $H_3$ and $H_4$ and widths $W_3$ and $W_4$. In detail, each of the fin-shaped structures 110 and 120 may have stair-shaped sidewalls, and the tread 180 and 190 of each of the stair-shaped sidewalls is proximately level with the top surface of the adjacent shallow trench isolation structure 106. The epitaxial layers 172 in the trench 136 may conformally disposed on the surfaces of the epitaxial layers 142 and is in direct contact with the top surface of the shallow trench isolation structure 106. The epitaxial layers 172 in the trench 146 may conformally disposed on the surfaces of the fin-shaped structures 120 and is in direct contact with the treads 190 of the fin-shaped structures 120. It should be noted that, since the epitaxial layers 142 and the epitaxial layers 172 are not fabricated concurrently, the compositions and thicknesses of the epitaxial layers 142 and 172 may be controlled independently.

Then, interface dielectric layers, high-k dielectric layers and gate metal layers may be sequentially deposited into the trenches 136 and 146 and on the interlayer dielectric 134. Subsequently, the interface dielectric layers, the high-k dielectric layers and the gate metal layers outside the trenches 136 and 146 may be removed completely by at least one planarization process so as to produce required metal gate structures.

Figure 12:
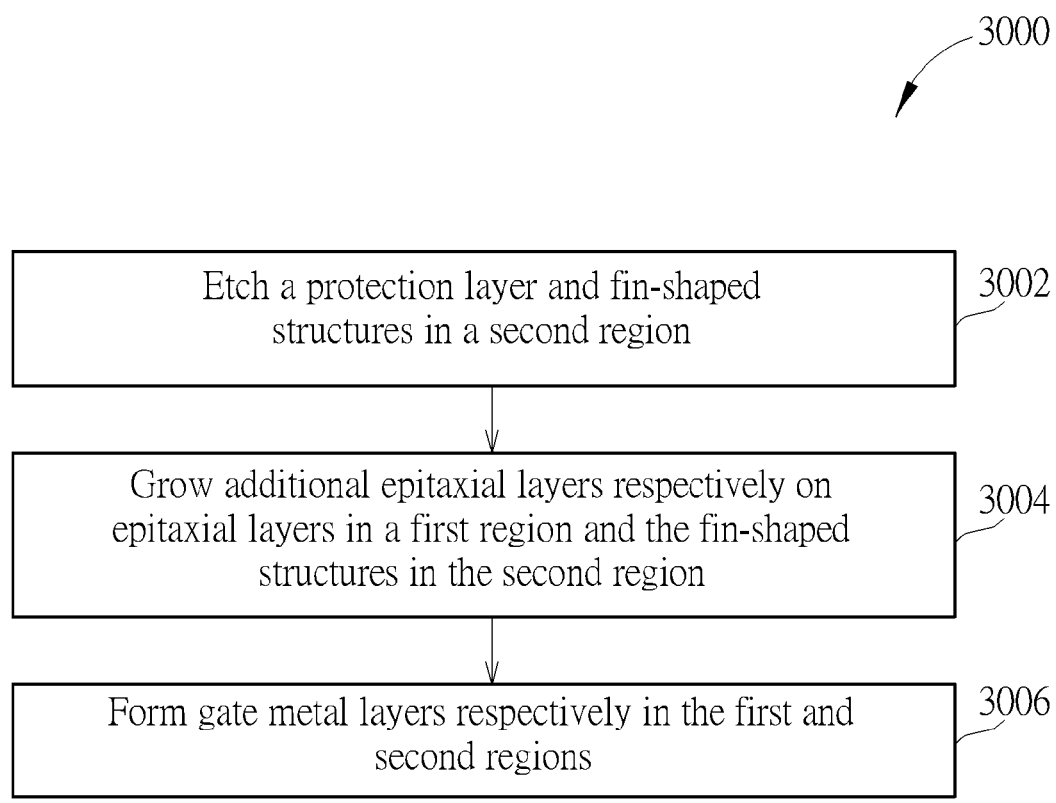
FIG. 12 is a flow chart of fabricating a semiconductor device in accordance of a third embodiment of the present invention.

FIG. 12 is a flow chart of fabricating a semiconductor device in accordance of a third embodiment of the present invention. Please refer to the flow chart in FIG. 12. A method for fabricating a semiconductor device in accordance of one embodiment of the present invention includes the following sequential steps: (1) step 3002: etching a protection layer and fin-shaped structures in a second region; (2) step 3004: growing additional epitaxial layers respectively on epitaxial layers in a first region and the fin-shaped structures in the second region; and (3) step 3006: forming gate metal layers respectively in the first and second regions. The method steps, processes, and operations described herein are not to be construed as necessarily requiring their performance in the particular order discussed or illustrated, unless specifically identified as an order of performance. It is also to be understood that additional or alternative steps may be employed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a semiconductor device, comprising:
   providing a substrate, having a first region and a second region;
   forming a plurality of fin-shaped structures, respectively disposed in the first region and the second region of the substrate;
   forming a protection layer, conformally covering the substrate and the fin-shaped structures;
   forming an interlayer dielectric in the first region and the second region, wherein the protection layer in the first region and the second region is partially exposed from the interlayer dielectric;
   forming an etch mask, covering the fin-shaped structures in the second region; and
   etching the protection layer exposed from the interlayer dielectric in the first region before removing the etch mask;
   growing an epitaxial layer on each of the fin-shaped structures exposed from the interlayer dielectric and in the first region after the step of etching the protection layer; and
   forming two gate metal layers, respectively covering the epitaxial layers in the first region and the protection layer in the second region.

2. The method of fabricating the semiconductor device of claim 1, further comprising forming two dummy gate structures respectively disposed in the first region and the second region before the step of forming the interlayer dielectric.

3. The method of fabricating the semiconductor device of claim 1, wherein the protection layer in the first region and exposed from the interlayer dielectric is completely removed during the step of etching the protection layer.

4. The method of fabricating the semiconductor device of claim 1, further comprising etching sidewalls of each of the fin-shaped structures in the first region during the step of etching the protection layer so as to generate stair-shaped sidewalls on the surfaces of the fin-shaped structures in the first region.

5. A method of fabricating a semiconductor device, comprising:
   providing a substrate, having a first region and a second region;
   forming a plurality of fin-shaped structures, respectively disposed in the first region and the second region of the substrate;
   forming a protection layer, conformally covering the substrate and the fin-shaped structures;
   forming an interlayer dielectric in the first region and the second region, wherein the protection layer in the first region and the second region is partially exposed from the interlayer dielectric;
   forming an etch mask, covering the fin-shaped structures in the second region;
   etching the protection layer exposed from the interlayer dielectric in the first region before removing the etch mask;
   growing an epitaxial layer on each of the fin-shaped structures exposed from the interlayer dielectric and in the first region after the step of etching the protection layer;
   depositing a dielectric layer, conformally covering each of the epitaxial layers in the first region and the etch mask in the second region;
   removing the etch mask and the dielectric layer in the second region; and
   etching the protection layer exposed from the interlayer dielectric and in the second region before removing the dielectric layer in the first region.

6. The method of fabricating the semiconductor device of claim 5, further comprising etching sidewalls of each of the fin-shaped structures in the second region during the step of etching the protection layer in the second region so as to generate stair-shaped sidewalls on the surfaces of the fin-shaped structures in the second region.

7. The method of fabricating the semiconductor device of claim 5,
   wherein after the step of etching the protection layer in the second region, the method further comprises:
   growing another epitaxial layers on each of the fin-shaped structures exposed from the interlayer dielectric and in the second region before removing the dielectric layer.

8. A method of fabricating a semiconductor device, comprising:
   providing a substrate, having a first region and a second region;
   forming a plurality of fin-shaped structures, respectively disposed in the first region and the second region of the substrate;
   forming a protection layer, conformally covering the substrate and the fin-shaped structures;

forming an interlayer dielectric in the first region and the second region, wherein the protection layer in the first region and the second region is partially exposed from the interlayer dielectric;

forming an etch mask, covering the fin-shaped structures in the second region;

etching the protection layer exposed from the interlayer dielectric in the first region before removing the etch mask;

growing an epitaxial layer on each of the fin-shaped structures exposed from the interlayer dielectric and in the first region after the step of etching the protection layer; and growing a plurality of another epitaxial layers, respectively disposed on the epitaxial layers in the first region and on the fin-shaped structures in the second region.

* * * * *